United States Patent [19]
Lan et al.

[11] Patent Number: 6,124,204
[45] Date of Patent: Sep. 26, 2000

[54] METHOD OF REMOVING COPPER OXIDE WITHIN VIA HOLE

[75] Inventors: Shih-Ming Lan, Chang-Hwa; Ho-Sung Liao, Yun-Lin Hsien; Hsien-Liang Meng, Hsinchu, all of Taiwan

[73] Assignee: United Silicon Incorporated, Hsinchu, Taiwan

[21] Appl. No.: 09/112,951

[22] Filed: Jul. 9, 1998

[30] Foreign Application Priority Data

May 21, 1998 [TW] Taiwan .................................. 87107910

[51] Int. Cl.$^7$ ...................................................... H01L 21/44
[52] U.S. Cl. .......................... 438/687; 438/906; 438/745
[58] Field of Search .................................. 438/688, 687, 438/677, 906, 745, 754

[56] References Cited

FOREIGN PATENT DOCUMENTS 6224193  9/1994  Japan .

OTHER PUBLICATIONS

S. E. Beck, et al. "Chenical vapor cleaning of transition metals from wafer surfaces", Proc. Third International Symp. on Ultra Clean Processing pp 257–260, (abstract only), Sep. 1996.

*Primary Examiner*—Caridad Everhart
*Attorney, Agent, or Firm*—Thomas, Kayden, Horstemeyer & Risley

[57] ABSTRACT

A method of removing a copper oxide layer within a via hole. A copper layer is formed. A dielectric layer is formed on the copper layer. A via hole is formed to penetrate through the dielectric layer and expose a part of the copper layer within the via hole. The exposed copper layer reacts with oxygen in air to form a copper oxide layer. Using 1,1,1,5, 5,5-hexafluoro-2,4-pentanedione, the copper oxide layer is removed.

4 Claims, 4 Drawing Sheets

METHOD OF REMOVING COPPER OXIDE WITHIN VIA HOLE

CROSS-REFERENCE TO RELATED APPLICATION

This application claims the priority benefit of Taiwan application serial no. 87107910, filed May 21, 1998, the full disclosure of which is incorporated herein by reference.

BACKGROUND OF THE INVENTION

1. Field of the Invention

The invention relates to a method of removing an oxide layer within a metal interconnect to reduce the resistance thereof, and more particularly, to a method of removing a copper oxide layer within a via hole.

2. Description of the Related Art

As the integrated circuits are developed towards a direction of more and more compact and complex, multilevel metallization process is commonly used to connect different conductive layers. Two important techniques, those of forming a contact plug and a via, are often employed in a semiconductor. Contact plug is an embedded part of a metal layer for connecting electrodes of a metal-oxide semiconductor (MOS). A via plug is used for connecting different metal layers.

It is known that aluminum has a very low resistivity and a good adhesive property when formed on a silicon oxide layer. However, as shown in FIG. 1, while conducting, aluminum atom drifts towards a grain boundary due to an electric field. This is the so-called "electromigration" effect. If the electromigration is strong enough to induce electron drift, an open circuit is caused to affect device reliability as shown in FIG. 2. Therefore, copper, instead of using aluminum, is used to form a via plug.

FIG. 3A to FIG. 3C shows a conventional method of forming a via plug. In FIG. 3A, on the electrode of a chip, a copper layer 300, a silicon nitride layer 302, and a silicon oxide layer 304 are formed in sequence. The formations of the silicon nitride layer 302 and silicon oxide layer 304 are used to isolate the metal layers for connecting different electrodes, and therefore, to avoid a short circuit. In addition, the silicon nitride layer 302 formed between the copper layer 300 and the silicon oxide layer is for the purpose of avoiding the formation of copper oxide by directly connecting the copper layer 300 and the silicon oxide 304.

In FIG. 3B, a via hole 306 is formed to penetrate through the silicon oxide layer 304 and the silicon nitride 302 layer, so that the copper layer 300 is exposed within the via hole. As shown in the figure, a copper oxide layer 310 is easily formed by exposing the copper layer 300 to oxygen molecule 308 in the air.

In FIG. 3C, a first metal layer 312 is formed and fills the via hole 306. Another metal layer 314 is formed on the silicon oxide layer 304 and the metal layer 312.

When the metal layer connects to an external electric field, the existence of a copper oxide layer 310 between the copper layer 312 and the metal layer 312 increases the resistivity.

SUMMARY OF THE INVENTION

It is therefore an object of the invention to provide a method of removing a copper oxide layer within a via hole. The copper oxide layer formed on the bottom surface of the via hole is removed by chemical, and then the via hole is filled with a metal layer to form a via. Therefore, the high resistivity due to the formation of the copper oxide layer is decreased, and the reliability of device is improved.

To achieve these objects and advantages, and in accordance with the purpose of the invention, as embodied and broadly described herein, the invention is directed towards a method of removing a copper oxide layer within a via hole. A copper layer is formed. A dielectric layer is formed on the copper layer. A via hole is formed to penetrate through the dielectric layer and expose a part of the copper layer within the via hole. The exposed copper layer reacts with oxygen in air to form a copper oxide layer. Using 1,1,1,5,5,5-hexafluoro-2,4-pentanedione, the copper oxide layer is removed.

It is to be understood that both the foregoing general description and the following detailed description are exemplary and explanatory only and are not restrictive of the invention, as claimed.

DESCRIPTION OF THE PREFERRED EMBODIMENTS

In FIG. 4A to FIG. 4E, a method of forming a via plug in a preferred embodiment according to the invention is shown.

Figure 1:
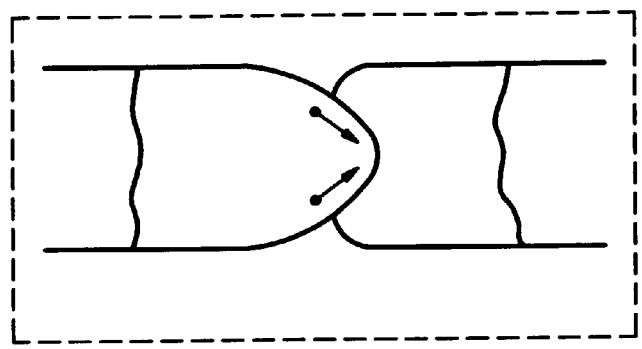
FIG. 1 shows that aluminum atom drifts towards a grain boundary due to electric field.
Figure 2:
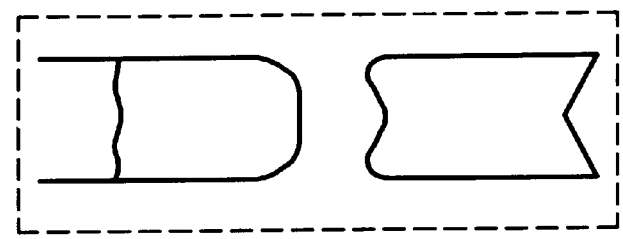
FIG. 2 shows an open circuit due to strong electromigration effect.
Figure 3A:
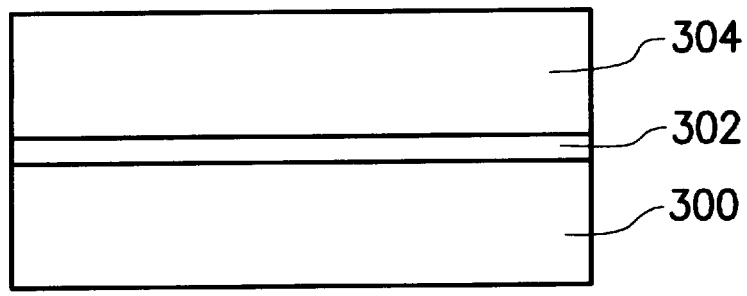
FIG. 3A to FIG. 3C shows a conventional method of forming a via plug.
Figure 3B:
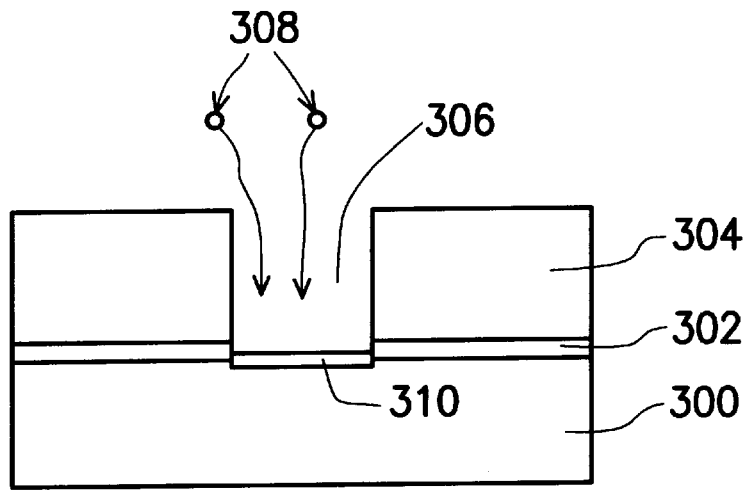
Figure 3C:
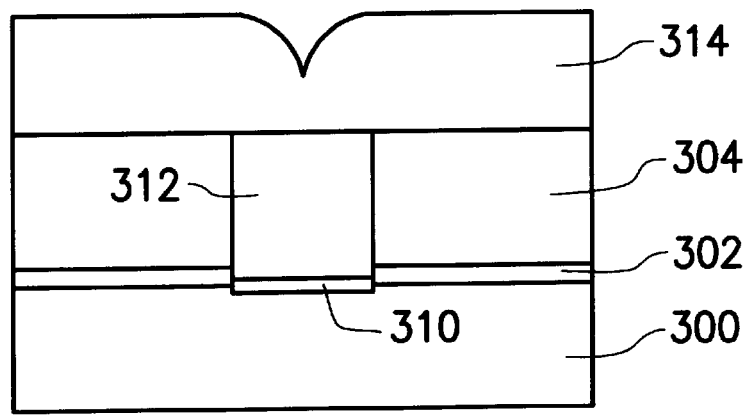
Figure 4A:
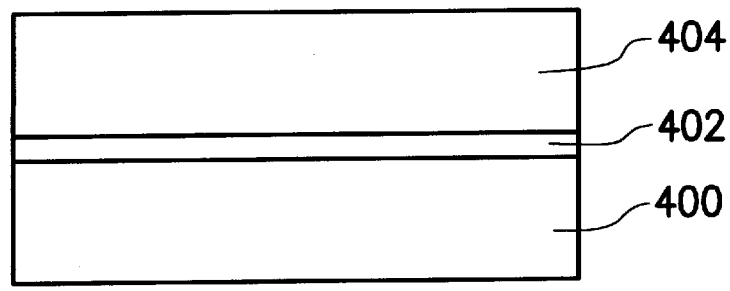
FIG. 4A to FIG. 4F shows a method of forming a via plug in a preferred embodiment according to the invention.

In FIG. 4A, on an electrode (not shown) of a chip, a copper layer 400, a silicon nitride layer 402, and a silicon oxide layer 404 are formed in sequence. The copper layer 400 is formed to electrically connect the electrode (not shown). The silicon nitride layer 402 and the silicon oxide layer 404 are formed to isolate metal layers for connecting different electrodes, and also to avoid a short circuit. The silicon nitride 402 is formed between the copper layer 400 and the silicon oxide layer 404 in order to avoid a direct contact between the copper layer 400 and the silicon oxide layer 404. Therefore, the possibility of forming a copper oxide layer is prevented.

Figure 4B:
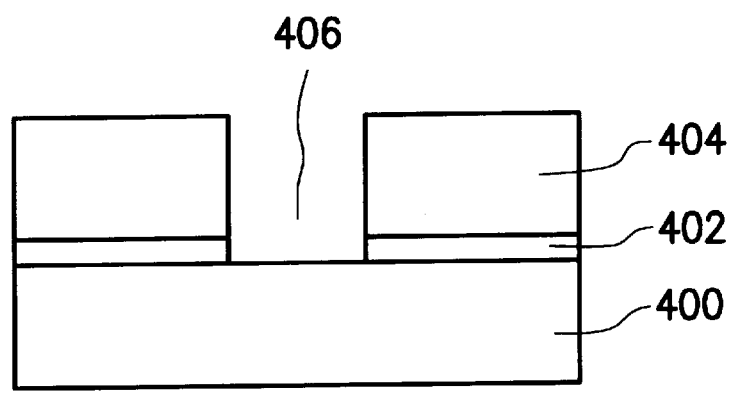
Figure 4C:
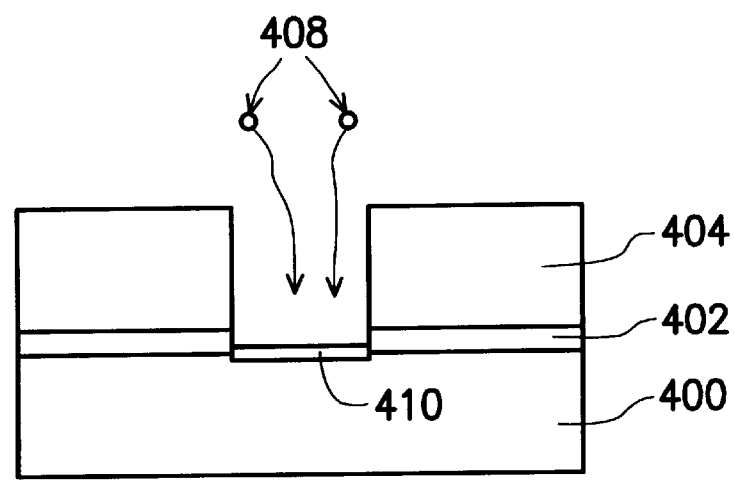

In FIG. 4B, a via hole 406 is formed to penetrate through the silicon nitride layer 402 and the silicon oxide layer 404 and to exposed a part of the copper layer 400 within the via hole. The exposed copper layer 400 reacts with oxygen 408 in air to form a copper oxide layer 410 as shown in FIG. 4C.

Figure 4D:
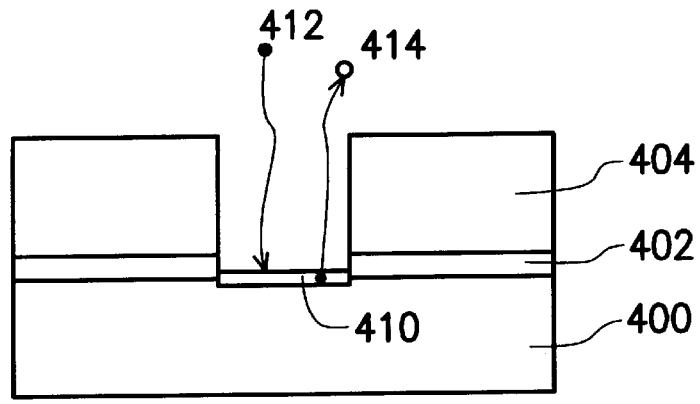
Figure 4E:
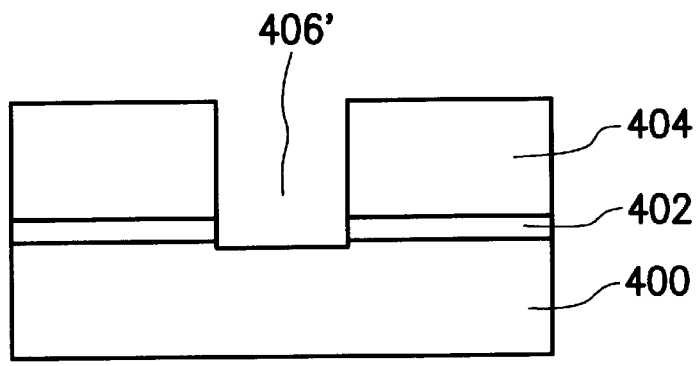

In FIG. 4D, using 1,1,1,5,5,5-hexafluoro-2,4-pentanedione 408 (H(hfac)), the copper oxide layer 410 is transformed into $Cu(hfac)_2$ 414 and is removed from the surface of the copper layer 400. The 1,1,1,5,5,5-hexafluoro-2,4-pentanedione 408 is in a liquid or a gaseous state. For a liquid state, the 1,1,1,5,5,5-hexafluoro-2,4-pentanedione 408 has a concentration of about 20% to 100% at a temperature of about 50° C. to 300°. The reaction time for the copper oxide layer 410 and the 1,1,1,5,5,5-hexafluoro-2,4-pentanedione 408 is about 5 seconds to 10 seconds. In addition, by raising the temperature, the reaction is speeded up, so that the reaction time is shortened. For a gaseous state, the 1,1,1,5,5,5-hexafluoro-2,4-pentanedione 408 has a pressure of about 500 mtorr to 5000 mtorr at a temperature of about 50° C. to 300°. In addition, by raising the temperature, the reaction is speeded up, so that the reaction time is shortened. After removing the copper oxide layer 410, the structure of the via hole 406' is as shown in FIG. 4E.

Figure 4F:
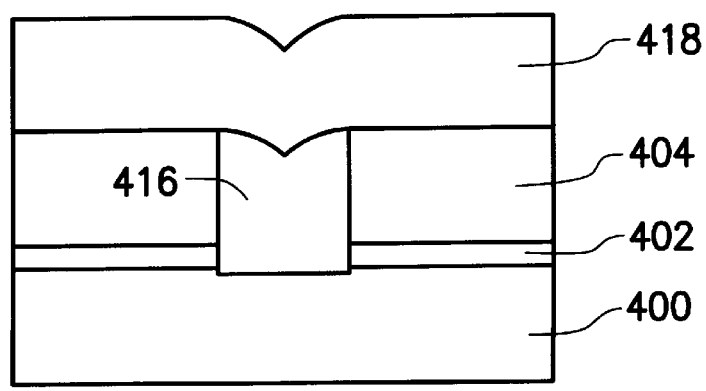

In FIG. 4F, after removing the copper oxide layer 410, a first metal layer, for example, a tungsten layer, is formed and fills the via hole 406' to form a via plug 416. A second metal layer 418, for example, an aluminum layer, is formed on the silicon oxide layer 404 and the via plug 416. The second metal layer 418 is electrically connected to the copper layer 400 by means of the via plug 416.

In the invention, using the 1,1,1,5,5,5-hexafluoro-2,4-pentanedione 408 to remove the copper oxide layer 410 within the via hole, a better contact is obtained and a lower resistivity is achieved to prolong the lifetime of a device.

Other embodiment of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of removing a copper oxide layer within a via hole, wherein a chip having an electrode formed thereon is provided, the method comprising:

forming a copper layer on the electrode;

form a dielectric layer on the copper layer;

forming a via hole penetrating through the dielectric layer and exposing a part of the copper layer within the via hole, so that the exposed copper layer is transformed into the copper oxide layer; and removing the copper oxide layer by using 1,1,1,5,5,5-hexafluoro-2,4-pentanedione, wherein the 1,1,1,5,5,5-hexafluoro-2,4-pentanedione is in a liquid state.

2. The method according to claim 1, wherein the dielectric layer comprises a silicon nitride layer and a silicon oxide layer.

3. A method of forming a via plug, wherein a chip having an electrode formed thereon is provided, the method comprising:

forming a copper layer on the electrode;

form a dielectric layer on the copper layer;

forming a via hole penetrating through the dielectric layer and exposing a part of the copper layer within the via hole, so that the exposed copper layer is transformed into the copper oxide layer;

removing the copper oxide layer by using 1,1,1,5,5,5-hexafluoro-2,4-pentanedione, wherein the 1,1,1,5,5,5-hexafluoro-2,4-pentanedione is in a liquid state; and filling the via hole with a metal layer, so that a via plug is formed.

4. The method according to claim 2, wherein the dielectric layer comprises a silicon nitride layer and a silicon oxide layer.

* * * * *